(12) United States Patent
Zhang et al.

(10) Patent No.: US 12,199,017 B2
(45) Date of Patent: Jan. 14, 2025

(54) SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Xiaoyan Zhang, Suzhou (CN); Jiawei Wen, Suzhou (CN); Yulong Zhang, Suzhou (CN); Jinhan Zhang, Suzhou (CN); Ronghui Hao, Suzhou (CN); Xingjun Li, Suzhou (CN); King Yuen Wong, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 17/618,881

(22) PCT Filed: Nov. 12, 2021

(86) PCT No.: PCT/CN2021/130455
§ 371 (c)(1),
(2) Date: Dec. 13, 2021

(87) PCT Pub. No.: WO2023/082204
PCT Pub. Date: May 19, 2023

(65) Prior Publication Data
US 2024/0063095 A1    Feb. 22, 2024

(51) Int. Cl.
*H01L 23/482*  (2006.01)
*H01L 23/528*  (2006.01)
(Continued)

(52) U.S. Cl.
CPC ...... *H01L 23/4824* (2013.01); *H01L 23/5283* (2013.01); *H01L 29/2003* (2013.01); *H01L 29/66462* (2013.01); *H01L 29/7786* (2013.01)

(58) Field of Classification Search
CPC ... H01L 23/482; H01L 23/5283; H01L 24/05; H01L 29/1066; H01L 29/2003; H01L 29/66462; H01L 29/7786
(Continued)

(56) References Cited

U.S. PATENT DOCUMENTS

2012/0305931 A1    12/2012  Chelakara et al.
2013/0234207 A1    9/2013   Choi et al.
(Continued)

FOREIGN PATENT DOCUMENTS

CN    112201689 A    1/2021
CN    113130643 A    7/2021
CN    113629016 A    11/2021

OTHER PUBLICATIONS

International Search Report and Written Opinion of the corresponding PCT application No. PCT/CN2021/130455 mailed on Jun. 24, 2022.

*Primary Examiner* — Fazli Erdem
(74) *Attorney, Agent, or Firm* — Li & Cai Intellectual Property (USA) Office

(57) ABSTRACT

A semiconductor device includes a nitride-based transistor, a first metal layer, a second metal layer, a third metal layer, a source pad, and a drain pad. The first metal layer is disposed over the nitride-based transistor. The second metal layer is disposed over the first metal layer. The third metal layer is disposed over the second metal layer and includes a first pattern and a second pattern which are spaced apart from each other. The source pad is immediately above the first metal layer, the second metal layer, and the first pattern of the third metal layer and is electrically coupled with the nitride-based transistor. The drain pad is immediately above the first metal layer, the second metal layer, and the second
(Continued)

pattern of the third metal layer and is electrically coupled with the nitride-based transistor.

20 Claims, 8 Drawing Sheets

(51) Int. Cl.
*H01L 29/20* (2006.01)
*H01L 29/66* (2006.01)
*H01L 29/778* (2006.01)

(58) Field of Classification Search
USPC .......................................................... 257/76
See application file for complete search history.

(56) References Cited

U.S. PATENT DOCUMENTS

| | | |
|---|---|---|
| 2016/0172295 A1 | 6/2016 | Lollio et al. |
| 2016/0190297 A1* | 6/2016 | Kudymov ........... H01L 29/2003 |
| | | 257/76 |
| 2017/0194477 A1* | 7/2017 | Lin ....................... H01L 29/402 |
| 2017/0221814 A1* | 8/2017 | Kinoshita ............. H01L 23/482 |
| 2018/0026125 A1* | 1/2018 | Liao .................. H01L 23/49562 |
| | | 257/316 |
| 2018/0122755 A1* | 5/2018 | Nakamura ............ H01L 23/528 |

* cited by examiner

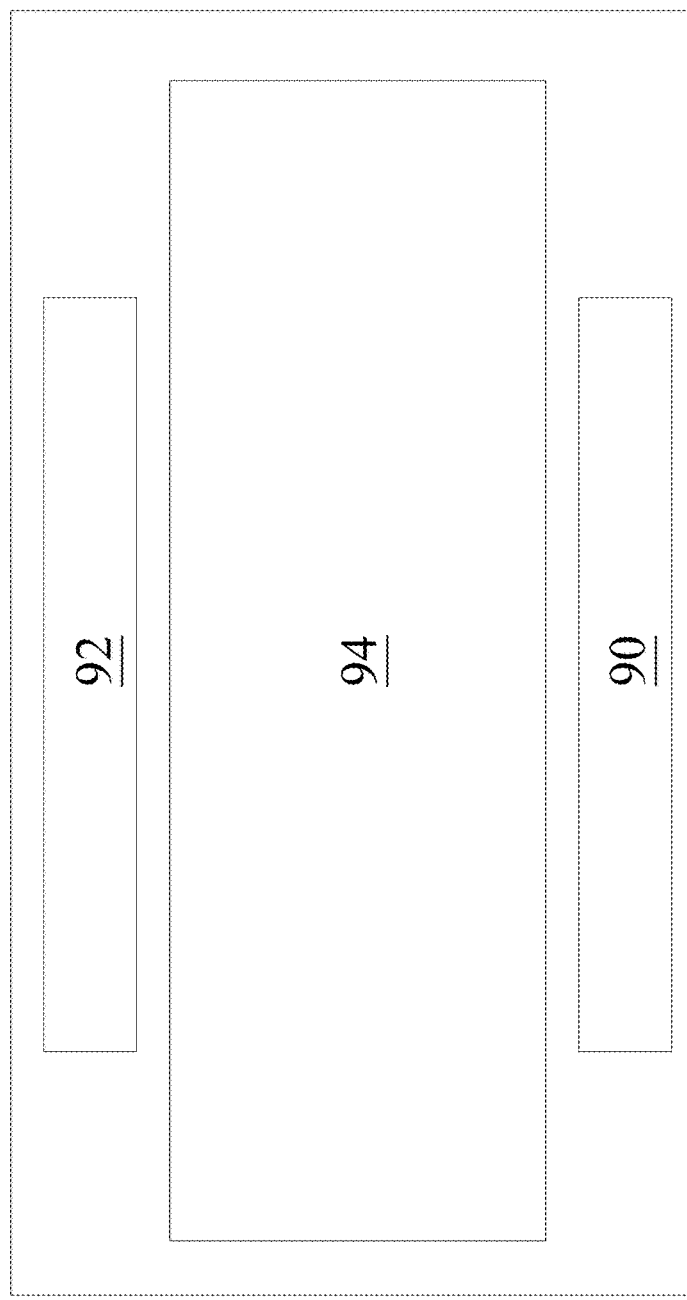

SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device including three metal layers and electrode pads over the metal layers.

BACKGROUND

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET). In order to meet more design requirements, HEMT devices need to become smaller. Accordingly, with miniaturization to them, there is a need for keeping reliability for those HEMT devices.

SUMMARY OF THE DISCLOSURE

In accordance with one aspect of the present disclosure, a semiconductor device is provided. The semiconductor device includes a nitride-based transistor, a first metal layer, a second metal layer, a third metal layer, a source pad, and a drain pad. The nitride-based transistor is disposed on a substrate. The first metal layer is disposed over the nitride-based transistor. The second metal layer is disposed over the first metal layer. The third metal layer is disposed over the second metal layer and includes a first pattern and a second pattern which are spaced apart from each other. The source pad is immediately above the first metal layer, the second metal layer, and the first pattern of the third metal layer and is electrically coupled with the nitride-based transistor. The drain pad is immediately above the first metal layer, the second metal layer, and the second pattern of the third metal layer and is electrically coupled with the nitride-based transistor.

In accordance with one aspect of the present disclosure, a semiconductor device is provided. The semiconductor device includes a nitride-based transistor, an interconnection circuit, a source pad, and a drain pad. The nitride-based transistor is disposed on a substrate. The interconnection circuit is disposed immediately above the nitride-based transistor and includes a plurality of metal layers at different levels of height. The metal layers have metal lines parallel with each other, and the metal lines at different levels of height vertically overlap with each other. The source pad is immediately above the interconnection circuit and is electrically coupled with the nitride-based transistor through the interconnection circuit. The drain pad is immediately above the interconnection circuit and is electrically coupled with the nitride-based transistor through the interconnection circuit.

In accordance with one aspect of the present disclosure, a method for manufacturing a semiconductor device is provided. The method includes steps as follows. A nitride-based transistor is formed over a substrate. A first metal layer is formed over the nitride-based transistor. A second metal layer is formed over the first metal layer. A third metal layer is formed over the second metal layer and includes a first pattern and a second pattern which are spaced apart from each other. A source pad is formed immediately above the first metal layer, the second metal layer, and the first pattern of the third metal layer. A drain pad is formed immediately above the first metal layer, the second metal layer, and the second pattern of the third metal layer.

By the above configuration, the semiconductor device at least includes two field plates for achieving a better electric field distribution. Two end portions of the first field plate vertically overlaps with the gate electrode and the second field plate, respectively. The second field plate is horizontally/laterally spaced away from the gate electrode instead of overlapping with the gate electrode. Such a configuration can alleviate the negative impact caused by parasitic capacitance; therefore, the semiconductor device can have good electrical properties.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which:

FIG. 2 depicts a plan view of a semiconductor device according to a comparative embodiment of the present disclosure;

DETAILED DESCRIPTION

Figure 1:
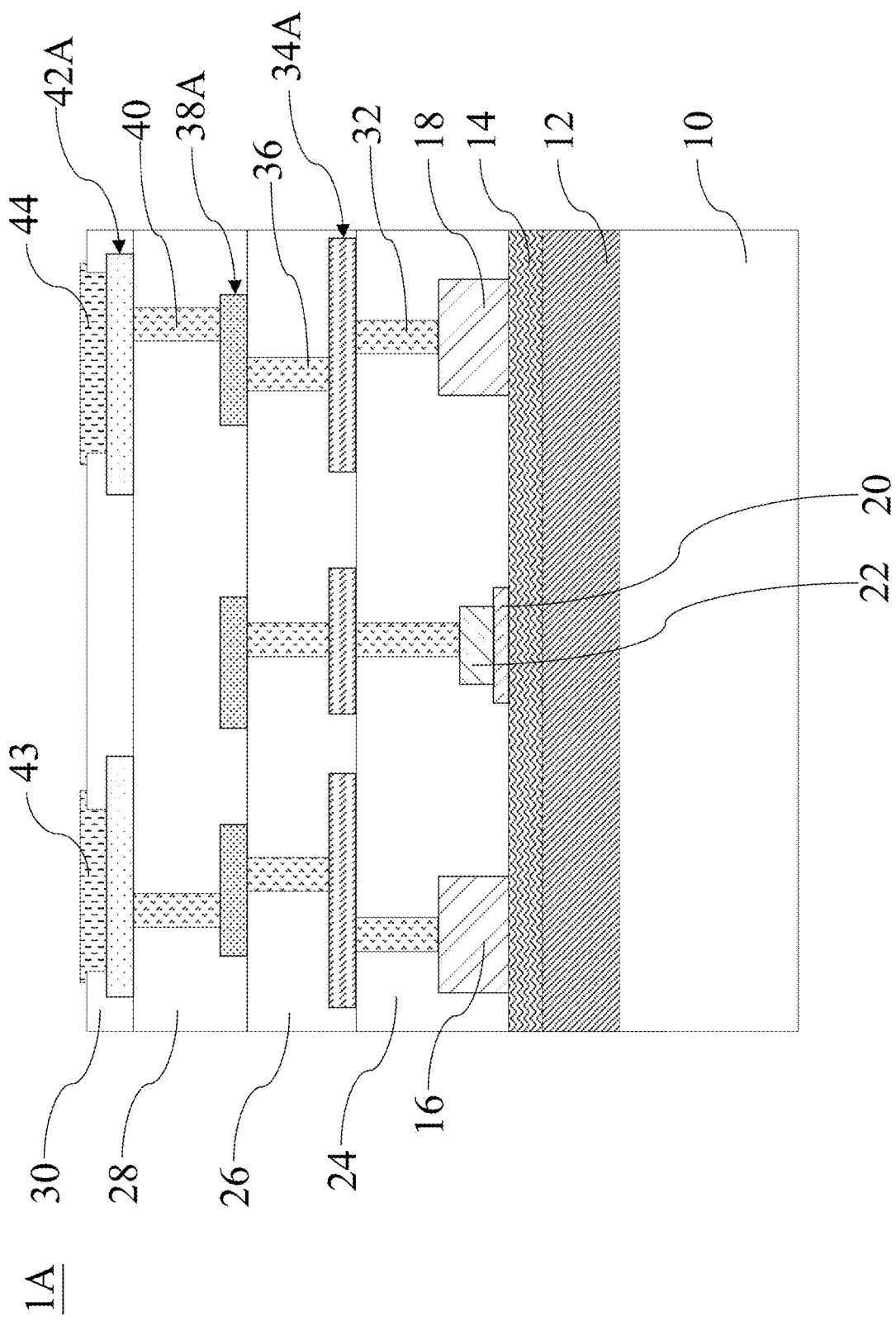
FIG. 1 is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

FIG. 1 is a vertical cross-sectional view of a semiconductor device 1A according to some embodiments of the present disclosure. The semiconductor device 1A includes a substrate 10, nitride-based semiconductor layers 12 and 14, electrodes 16 and 18, a doped nitride-based semiconductor layer 20, a gate electrode 22, dielectric layers 24, 26, 28, 30, contact vias 32, 36, 40, metal layers 34A, 38A, 42A, and electrode pads 43 and 44.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof. In some embodiments, the material of the substrate 10 can include a silicon substrate with a <111> orientation.

In some embodiments, the substrate 10 can include a buffer layer. The buffer layer can be in contact with the nitride-based semiconductor layer 12. The buffer layer can be configured to reduce lattice and thermal mismatches between the substrate 10 and the nitride-based semiconductor layer 12, thereby curing defects due to the mismatches/difference. The buffer layer may include a III-V compound. The III-V compound can include, for example but are not limited to, aluminum, gallium, indium, nitrogen, or combinations thereof. Accordingly, the exemplary materials of the buffer layer can further include, for example but are not limited to, GaN, AlGaN, InAlGaN, or combinations thereof.

In some embodiments, the substrate 10 may further include a nucleation layer (not shown). The nucleation layer may be formed beneath the buffer layer. The nucleation layer can be configured to provide a transition to accommodate a mismatch/difference between the substrate 10 and a III-nitride layer of the buffer layer. The exemplary material of the nucleation layer can include, for example but is not limited to AlN or any of its alloys.

The nitride-based semiconductor layer 12 is disposed on/over/above the buffer layer. The nitride-based semiconductor layer 14 is disposed on/over/above the nitride-based semiconductor layer 12. The exemplary materials of the nitride-based semiconductor layer 12 can include, for example but are not limited to, nitrides or group III-V compounds, such as GaN, AlN, InN, $In_xAl_yGa_{(1-x-y)}N$ where $x+y\leq1$, $Al_xGa_{(1-x)}N$ where $x\leq1$. The exemplary materials of the nitride-based semiconductor layer 14 can include, for example but are not limited to, nitrides or group III-V compounds, such as GaN, AlN, InN, $In_xAl_yGa_{(1-x-y)}N$ where $x+y\leq1$, $Al_yGa_{(1-y)}N$ where $y\leq1$.

The exemplary materials of the nitride-based semiconductor layers 12 and 14 are selected such that the nitride-based semiconductor layer 14 has a bandgap (i.e., forbidden band width) greater/higher than a bandgap of the nitride-based semiconductor layer 12, which causes electron affinities thereof different from each other and forms a heterojunction therebetween. For example, when the nitride-based semiconductor layer 12 is an undoped GaN layer having a bandgap of approximately 3.4 eV, and the nitride-based semiconductor layer 14 can be selected as an AlGaN layer having bandgap of approximately 4.0 eV. As such, the nitride-based semiconductor layers 12 and 14 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

The electrodes 16 and 18 can be disposed on/over/above the nitride-based semiconductor layer 14. The electrodes 16 and 18 can be in contact with the nitride-based semiconductor layer 14. In some embodiments, the electrode 16 can serve as a source electrode. In some embodiments, the electrode 16 can serve as a drain electrode. In some embodiments, the electrode 18 can serve as a source electrode. In some embodiments, the electrode 18 can serve as a drain electrode. The role of the electrodes 16 and 18 depends on the device design.

In some embodiments, the electrodes 16 and 18 can include, for example but are not limited to, metals, alloys, doped semiconductor materials (such as doped crystalline silicon), compounds such as silicides and nitrides, other conductor materials, or combinations thereof. The exemplary materials of the electrodes 16 and 18 can include, for example but are not limited to, Ti, AlSi, TiN, or combinations thereof. The electrodes 16 and 18 may be a single layer, or plural layers of the same or different composition. In some embodiments, the electrodes 16 and 18 form ohmic contacts with the nitride-based semiconductor layer 14. The ohmic contacts can be achieved by applying Ti, Al, or other suitable materials to the electrodes 16 and 18. In some embodiments, each of the electrodes 16 and 18 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The doped nitride-based semiconductor layer 20 can be disposed on/over/above the nitride-based semiconductor layer 14. The doped nitride-based semiconductor layer 20 can be in contact with the nitride-based semiconductor layer 14. The doped nitride-based semiconductor layer 20 can be disposed between the electrodes 16 and 18.

The gate electrode 22 can be disposed on/over/above the doped nitride-based semiconductor layer 20. The gate electrode 22 can be in contact with the doped nitride-based semiconductor layer 20, such that the doped nitride-based semiconductor layer 20 can be disposed/sandwiched between the gate electrode 22 and the nitride-based semiconductor layer 14. The gate electrode 22 can be disposed between the electrodes 16 and 18.

In some embodiments, the electrodes 16 and 18 and the gate electrode 22 can constitute a nitride-based transistor with the 2DEG region. The electrode 16 can serve as a source electrode for the nitride-based transistor. The electrode 18 can serve as a drain electrode for the nitride-based transistor.

In the exemplary illustration of FIG. 1, the semiconductor device 1A is an enhancement mode device, which is in a normally-off state when the gate electrode 22 is at approximately zero bias. Specifically, the doped nitride-based semiconductor layer 20 may create at least one p-n junction with the nitride-based semiconductor layer 12 to deplete the 2DEG region, such that zones of the 2DEG region corresponding to positions below the gate electrode 22 has different characteristics (e.g., different electron concentrations) than the remaining of the 2DEG region and thus is blocked. Due to this mechanism, the semiconductor device 1A has a normally-off characteristic. In other words, when no voltage is applied to the gate electrode 22 or a voltage applied to the gate electrode 22 is less than a threshold voltage (i.e., a minimum voltage required to form an inversion layer below the gate electrode 22), the zone of the 2DEG region below the gate electrode 22 is kept blocked, and thus no current flows therethrough.

In some embodiments, the doped nitride-based semiconductor layer 20 can be omitted, such that the semiconductor device 1A is a depletion-mode device, which means the semiconductor device 1A in a normally-on state at zero gate-source voltage.

The doped nitride-based semiconductor layer 20 can be p-type doped III-V semiconductor layers. The exemplary materials of the doped nitride-based semiconductor layer 20 can include, for example but are not limited to, p-doped group III-V nitride semiconductor materials, such as p-type GaN, p-type AlGaN, p-type InN, p-type AlInN, p-type InGaN, p-type AlInGaN, or combinations thereof. In some embodiments, the p-doped materials are achieved by using a p-type impurity, such as Be, Zn, Cd, and Mg. In some embodiments, the nitride-based semiconductor layer 12 includes undoped GaN and the nitride-based semiconductor layer 14 includes AlGaN, and the doped nitride-based semiconductor layer 20 is a p-type GaN layer which can bend the underlying band structure upwards and deplete the corresponding zone of the 2DEG region, so as to place the semiconductor device 1A into an off-state condition.

The exemplary materials of the gate electrode 22 may include metals or metal compounds. The gate electrode 22 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

The dielectric layer 24 can be disposed on/over/above the nitride-based semiconductor layer 14, the electrodes 16 and 18 and the gate electrode 22. The dielectric layer 26 can be disposed on/over/above the dielectric layer 24. The dielectric layer 28 can be disposed on/over/above the dielectric layer 26. The dielectric layer 30 can be disposed on/over/above the dielectric layer 28. Each of the dielectric layers 24, 26, 28 can serve as an interlayer dielectric (ILD) or an inter metal dielectric (IMD). The dielectric layer 30 can serve as a protection layer.

The material of the dielectric layers 24, 26, 28, and 30 can include, for example but is not limited to, dielectric materials. For example, the dielectric layers 24, 26, 28, and 30 include SiNX (e.g., $Si_3N_4$), $SiO_x$, $Si_3N_4$, SiON, SiC, SiBN, SiCBN, oxides, nitrides, oxides, nitrides, plasma-enhanced oxide (PEOX), or combinations thereof.

To comply the desired device design, the dielectric layer 28 may have parameters than other dielectric layers 24, 26, and 30. In some embodiments, the dielectric layer 28 may have a dielectric constant higher than other dielectric layers 24, 26, and 30. In some embodiments, the dielectric layer 28 may have a thickness greater than other dielectric layers 24, 26, and 30.

The conductive vias 32 are disposed within the dielectric layer 24. The conductive vias 32 can extend upward from the corresponding element. For example, the conductive vias 32 can extend upward from the electrodes 16 and 18 and the gate electrode 22. The conductive vias 36 are disposed within the dielectric layer 26. The conductive vias 40 are disposed within the dielectric layer 28. The vias 32, 36, and 40 can be configured to electrically connect the electrodes 16 and 18 and the gate electrode 22 to other layers/components/elements. The exemplary materials of the conductive vias 32, 36, and 40 can include, for example but are not limited to, conductive materials, such as metals or alloys.

The metal layer 34A can be disposed between the dielectric layers 24 and 26. The metal layer 34A can electrically connect the contact vias 32 to the contact vias 36. The metal layer 38A can be disposed between the dielectric layers 26 and 28. The metal layer 38A can electrically connect the contact vias 36 to the contact vias 40. The metal layer 42A can be disposed between the dielectric layers 28 and 30. The metal layer 42A can electrically connect the contact vias 32 to other components/layers/elements.

The metal layers 34A, 38A, and 42A may have metal lines, pads, traces, or combinations thereof. The metal layers 34A, 38A, and 42A may have metal lines at different levels of height. The metal lines of the metal layers 34A, 38A, and 42A vertically overlap with each other. The metal layers 34A, 38A, and 42A at different levels of height can form at least one interconnection circuit. The circuit can be configured to electrically connect to the electrodes 16 and 18 and the gate electrode 22 to other components/layers/elements.

The exemplary materials of the metal layers 34A, 38A, and 42A can include, for example but are not limited to, conductive materials. At least one of the metal layers 34A, 38A, and 42A may include a single film or multilayered film having Ag, Al, Cu, Mo, Ni, Ti, alloys thereof, oxides thereof, nitrides thereof, or combinations thereof.

In some embodiments, the metal layers 34A, 38A, and 42A can serve as metal layers. For example, the metal layer 34A can serve as a metal one (M1) layer; the metal layer 38A can serve as a metal two (M2) layer; and the metal layer 42A can serve as a top metal layer (TM).

The electrode pad 43 is located over the metal layer 42A. The electrode pad 43 can make contact with the metal layer 42A. The electrode pad 43 is immediately above the metal layers 34A, 38A, and 42A. The electrode pad 43 is immediately above the interconnection circuit constituted by the metal layers 34A, 38A, and 42A. The electrode pad 43 can be enclosed/surrounded by the dielectric layer 30. The electrode pad 43 can have a top surface free from the coverage of the dielectric layer 30. The electrode pad 43 can be electrically coupled with the electrode 16 through the contact vias 32, 36, 40 and the metal layers 34A, 38A, and 42A (i.e., through the interconnection circuit). Accordingly, the electrode pad 43 can be electrically coupled with the source electrode of the nitride-based transistor 16. The electrode pad 43 can be referred to as a source pad.

The electrode pad 44 is located over the metal layer 42A. The electrode pad 44 can make contact with the metal layer 42A. The electrode pad 44 is immediately above the metal layers 34A, 38A, and 42A. The electrode pad 44 is immediately above the interconnection circuit constituted by the metal layers 34A, 38A, and 42A. The electrode pad 44 can be enclosed/surrounded by the dielectric layer 30. The electrode pad 44 can have a top surface free from the coverage of the dielectric layer 30. The electrode pad 44 can be electrically coupled with the electrode 18 through the contact vias 32, 36, 40 and the metal layers 34A, 38A, and 42A (i.e., through the interconnection circuit). Accordingly, the electrode pad 44 can be electrically coupled with the drain electrode of the nitride-based transistor 16. The electrode pad 44 can be referred to as a drain pad.

The semiconductor device 1A can be manufactured by deposition technology. For example, after the formation of the nitride-based transistor constituted by the electrodes 16 and 18 and the gate electrode 22, metal layers 34A, 38A, and 42A can be formed in sequence over the nitride-based transistor. The metal layers 34A, 38A, and 42A can have respective patterns to achieve the desired layout. Then, the electrode pads 43 and 44 are formed at corresponding regions to electrically connect the metal layers 34A, 38A, and 42A. In some embodiments, the formation of the metal layers 34A, 38A, and 42A and the electrode pads 43 and 44 involve a patterning process.

In the present disclosure, since the electrode pads 43 and 44 are immediately above the metal layers 34A, 38A, and 42A, the dimension of the semiconductor device 1A can get reduced. For example, a width of the semiconductor device 1A can get reduced.

To illustrate, FIG. 2 depicts a plan view of a semiconductor device 2A according to a comparative embodiment of the present disclosure. The semiconductor device 2A includes a drain pad 90, a source pad 92, and a circuit 94 between the drain and source pads 90 and 92. The circuit 94 can be composed by contact vias and metal layers. The circuit 94 can electrically couple with a source and a drain of the semiconductor device 2A. The circuit 94 can electrically couple with the drain and source pads 90 and 92. The circuit 94 electrically couplings with the drain and source pads 90 and 92 is spaced apart from the drain and source pads 90 and 92 in the top-view. The reason is related to that the drain pad 90 needs to be applied by a high voltage so the circuit 94 is arranged at a position as more independent of the drain and source pads 90 and 92 as possible. However, such the arrangement will increase the dimension of the semiconductor device 2A.

As afore described, the electrode pads 43 and 44 are immediately above the metal layers 34A, 38A, and 42A, so the electrode pads 43 and 44 and the metal layers 34A, 38A, and 42A can overlap with each other in the top view, reducing the dimension of the semiconductor device 1A.

In this regard, once electrode pads and metal layers are re-arranged to overlap with each other but the layout of them remains, breakdown voltage issue may occur as a high voltage is applied to the corresponding electrode pad. In the present disclosure, a layout for metal layers is provide, which can avoid a breakdown voltage issue as electrode pads and metal layers are arranged to overlap with each other, thereby keeping the reliability of the semiconductor device stable.

Figure 3A:
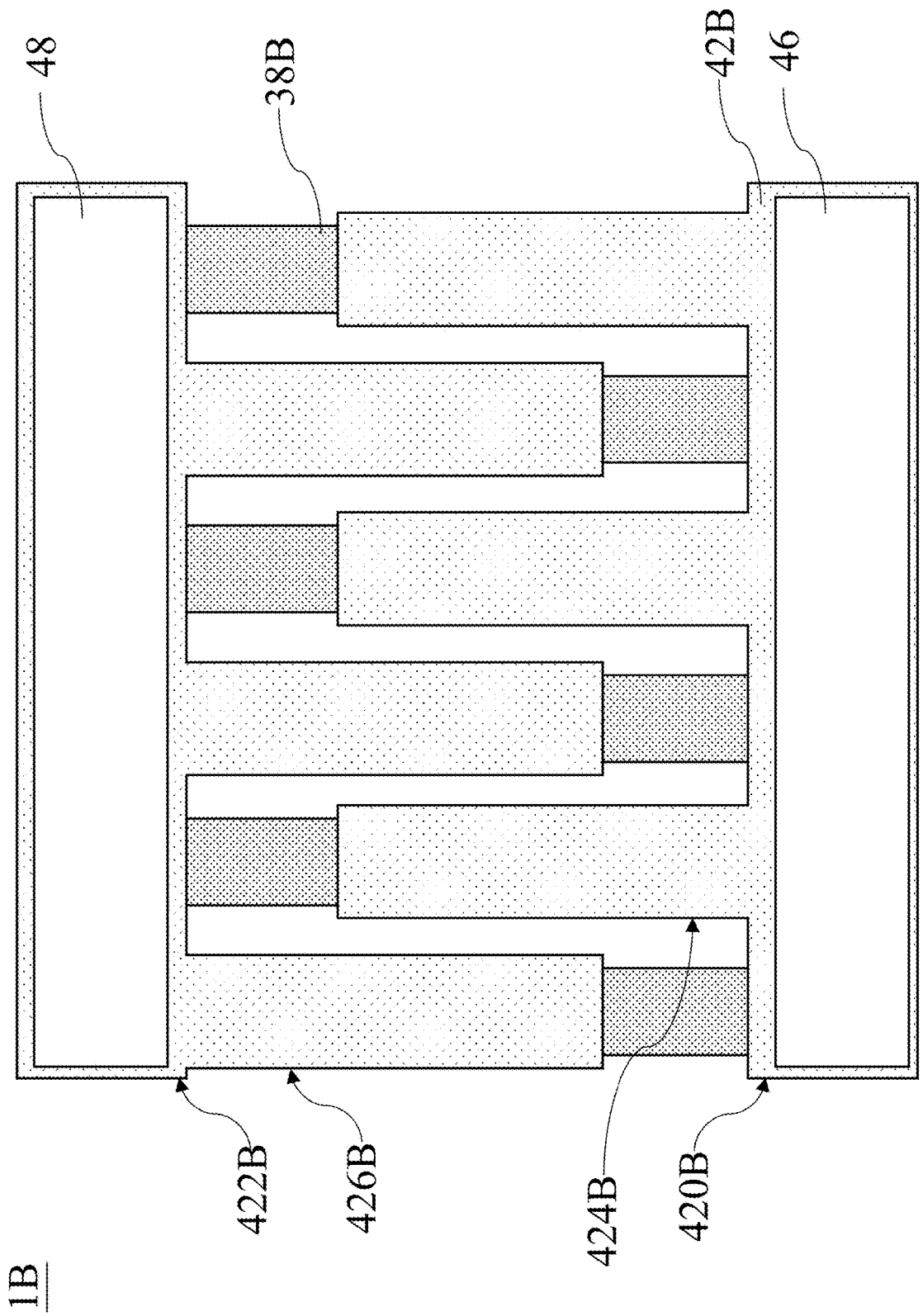
FIG. 3A is a top view of a semiconductor device according to some embodiments of the present disclosure.

FIG. 3A is a top view of a semiconductor device 1B according to some embodiments of the present disclosure. A metal layer 38B serves as a metal two (M2) layer. A metal layer 42B serves as a top metal (TM) layer. An electrode pad 46 is disposed to overlap with the metal layer 42B. An electrode pad 48 is disposed to overlap with the metal layer 42B. The metal layer 42B includes patterns 420B and 422B which are separated from each other. The patterns 420B and 422B are electrically isolated from each other.

An outer boundary of the electrode pad 46 is located within the pattern 420B of the metal layer 42B. An outer boundary of the electrode pad 48 is located within the pattern 422B of the metal layer 42B. By such the configuration, the semiconductor device 1B can have a compact layout, thereby improving the space utilization. That is, no need to provide space other than the top metal for placing the electrode pads 46 and 48.

The pattern 420B of the metal layer 42B has strip portions 424B which extend toward the pattern 422B. The strip portions 424B of the pattern 420B are spaced apart from the pattern 422B. The pattern 422B of the metal layer 42B has strip portions 426B which extend toward the pattern 420B. The strip portions 426B of the pattern 422B are spaced apart from the pattern 420B.

The strip portions 424B and the strip portions 426B can be parallel with each other. More specifically, the strip portions 424B and the strip portions 426B can extend along a vertical direction of FIG. 3A. The strip portions 424B and the strip portions 426B can be arranged along a horizontal direction of FIG. 3A which is different than the vertical direction. The pattern 420B of the metal layer 42B is finger-shaped. The pattern 422B of the metal layer 42B is finger-shaped.

A reason of placing three metal layers (i.e., M1, M2, and TM) in the structure is to avoid breakdown voltage damage. The configuration of the three metal layers and the profile design of the top metal can serve as core factors to avoid breakdown voltage damage.

Figure 3B:
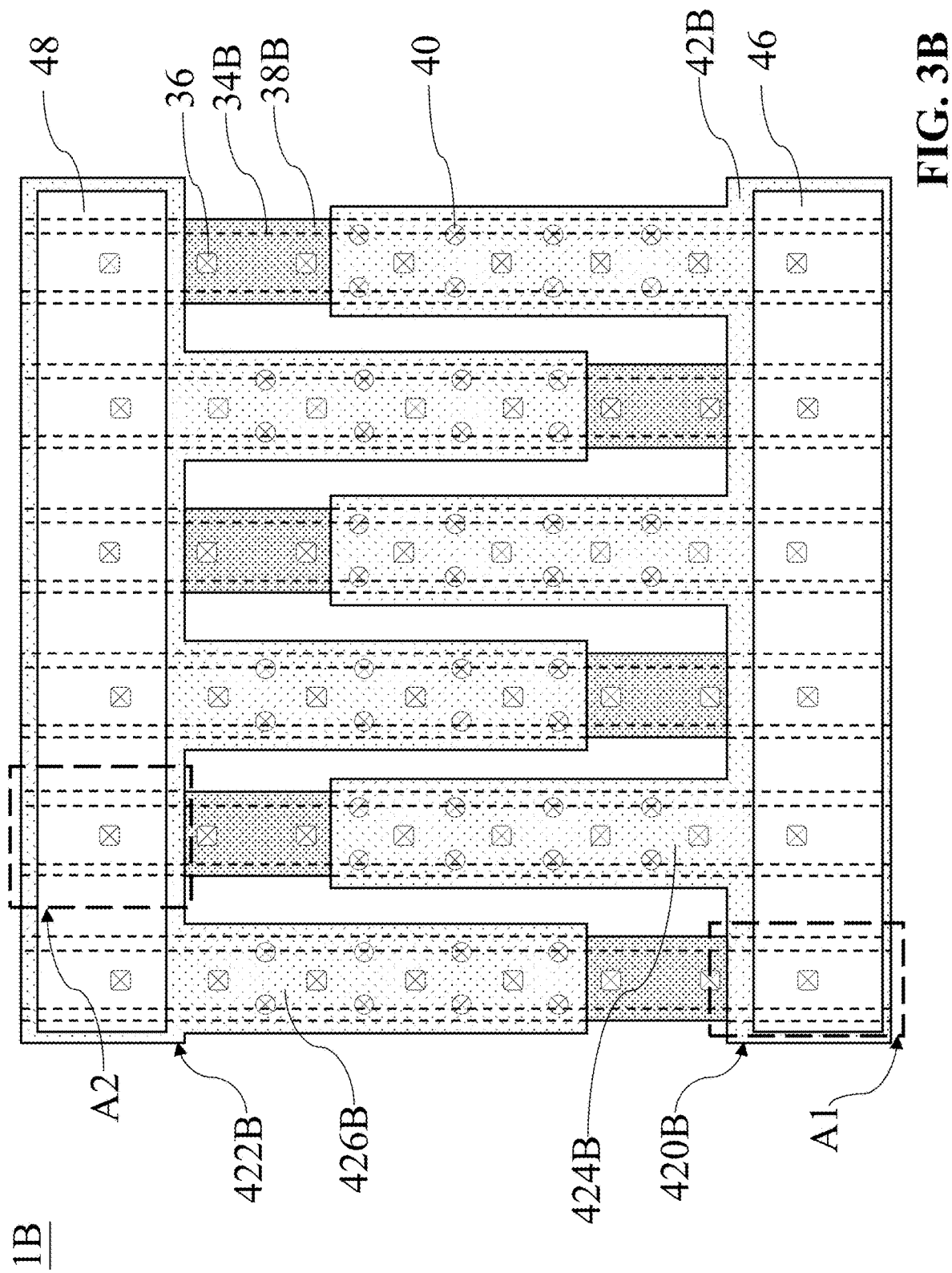
FIG. 3B depicts a further layout of the semiconductor device of FIG. 3A according to some embodiments of the present disclosure.

To explain the mechanism, FIG. 3B depicts a further layout of the semiconductor device 1B of FIG. 3A according to some embodiments of the present disclosure. Herein, the phrase "further layout" includes illustration of boundaries of layers and contact vias therein. The further layout shows a boundary of a layer which is covered by an upper layer, which means the boundary of the layer may be invisible in the top view but can be found in the layout.

A metal layer 34B serves as a metal one (M1) layer. The metal layer 34B is underlying the metal layers 38B and 42B. The metal layer 34B has multi striped patterns. The striped patterns of the metal layer 34B can extend along a vertical direction of FIG. 3B. The striped patterns of the metal layer 34B can extend along a vertical direction of FIG. 3B can be arranged along a horizontal direction of FIG. 3B. The striped patterns of the metal layer 34B can extend from the electrode pad 46 to the electrode pad 48. The striped patterns of the metal layer 34B can extend from a position beneath the electric pad 46 to a position beneath the electric pad 48.

The metal layer 38B is underlying the metal layer 42B. The metal layer 38B has multi striped patterns. The striped patterns of the metal layer 38B can extend along the vertical direction of FIG. 3B. The striped patterns of the metal layer 38B can be arranged along the horizontal direction of FIG. 3B. The striped patterns of the metal layer 38B can extend from the electrode pad 46 to the electrode pad 48. The striped patterns of the metal layer 38B can extend from a position beneath the electric pad 46 to a position beneath the electric pad 48.

Each of the striped patterns of the metal layer 34B is narrower than each of the striped patterns of the metal layer 38B. The striped patterns of the metal layer 34B can be covered up by the metal layer 38B.

Contact vias 36 can be disposed between the metal layer 34B and the metal layer 38B. That is, as afore described, in the side view, the metal layer 38B is in a position higher than the contact vias 36; and each of the contact vias 36 is in a position higher than the metal layer 34B. The contact vias 36 can electrically connect the metal layer 34B to the metal layer 38B. In the exemplary illustration of FIG. 3B, each of the striped patterns of the metal layer 34B is electrically connected to corresponding one of the striped patterns of the metal layer 38B through the contact vias 36.

The pattern 420B of the metal layer 42B vertically overlaps with the metal layer 38B. The strip portions 424B of the pattern 420B of the metal layer 42B align with the striped patterns of the metal layer 38B. Each of the striped patterns of the metal layer 38B is narrower than each of the strip portions 424B of the pattern 420B of the metal layer 42B.

The pattern 422B of the metal layer 42B vertically overlaps with the metal layer 38B. The strip portions 426B of the pattern 422B of the metal layer 42B align with the striped patterns of the metal layer 38B. Each of the striped patterns of the metal layer 38B is narrower than each of the strip portions 426B of the pattern 422B of the metal layer 42B. In some embodiments, the metal lines of the metal layers 34B, 38B, and 42B are at different levels of height and have different widths.

Contact vias 40 can be disposed between the metal layer 38B and the metal layer 42B. That is, as afore described, in the side view, the metal layer 42B is in a position higher than the contact vias 40; and each of the contact vias 40 is in a position higher than the metal layer 38B. The contact vias 40 can electrically connect the metal layer 38B to the metal layer 42B. In the exemplary illustration of FIG. 3B, each of the striped patterns of the metal layer 38B is electrically connected to corresponding one of the strip portions 424B and 426B of the patterns 420B and 422B of the metal layer 42B through the contact vias 40.

The striped patterns of the metal layer 38B can be grouped to electrically couple with different groups of the strip portions 424B and 426B of the patterns 420B and 422B of the metal layer 42B. In the exemplary illustration of FIG. 3B, from left to right, the stripe patterns of the metal layer 38B at the odd-numbered position are electrically couple with the strip portions 426B of the patterns 422B of the metal layer 42B. In the exemplary illustration of FIG. 3B, from left to right, the stripe patterns of the metal layer 38B at the even-numbered position are electrically couple with the strip portions 424B of the patterns 420B of the metal layer 42B.

The electrode pad 46 overlaps with the metal layers 34B and 38B. The electrode pad 46 overlaps with the pattern 420B of the metal layer 42B. The electrode pad 48 overlaps with the metal layers 34B and 38B. The electrode pad 48 overlaps with the pattern 422B of the metal layer 42B.

During a high voltage operation of the semiconductor device 1B, a relatively high voltage is applied to the electrode pad 46 and a relatively low voltage is applied to the electrode pad 48. In some embodiment, the difference between the high and low voltages is in a range from about 150V to about 1200V. An electric field is generated in response to the applied voltages. In this regard, the profile of the patterns 420B and 422B of the metal layer 42B is related to the distribution of the electric field. The strip portions 424B and 426B of the patterns 420B and 422B of the metal layer 42B are periodical and overlap with the stripe patterns of the metal layer 38B so the distribution of the electric field can be modulated to comply the device design. More specifically, the distribution of the electric field with the modulation is predictable.

For example, in response to the applied voltages, some regions may be affected by the high voltage difference. An area A1 is sandwiched between the pattern 420B of the metal layer 42B and the first one of the stripe patterns of the metal layer 38B so it is affected by the high voltage difference. Similarly, an area A2 is sandwiched between the pattern 422B of the metal layer 42B and the second one of the stripe patterns of the metal layer 38B so it is affected by the high voltage difference. The device design can apply a corresponding manner to cure such the areas because the affection to these areas is predictable.

In some embodiment, a dielectric layer (e.g., the dielectric layer 28 in FIG. 1) between the metal layers 38B and 42B can have a thickness enough to resist the high voltage difference. In some embodiment, a dielectric layer between the metal layers 38B and 42B can have a dielectric constant enough to resist the high voltage difference. For example, a dielectric layer between the metal layers 38B and 42B can include a high k material, in which the k number is greater than about 3.6.

As such, the issues raised from the high voltage difference can be cured, so it is available that the electrode pads 46 and 48 are arranged to overlap with the metal layers 34B, 38B, and 42B, thereby getting the dimension of the semiconductor device 1B reduced. On the contrary, once electrode pads are placed at a position overlapping with metal layers without designing a profile of a top metal layer, a high voltage difference may damage a device since no corresponding layout is made.

Briefly, the present disclosure is to provide a solution that makes layout of a GaN-based HEMT device have a circuit under pad (CUP) configuration, which can replace a non-CUP configuration, so as to effectively reduce die size. Accordingly, with respect to the same unit area, die quantity can be improved. As a top metal is designed as being strip-shaped, breakdown events at high voltage difference areas between source and drain traces can be avoided. The strip-shaped top metal is designed to avoid capacitance greatly rising, which can be achieved by optionally position a dielectric layer correspondingly.

Figure 4A:
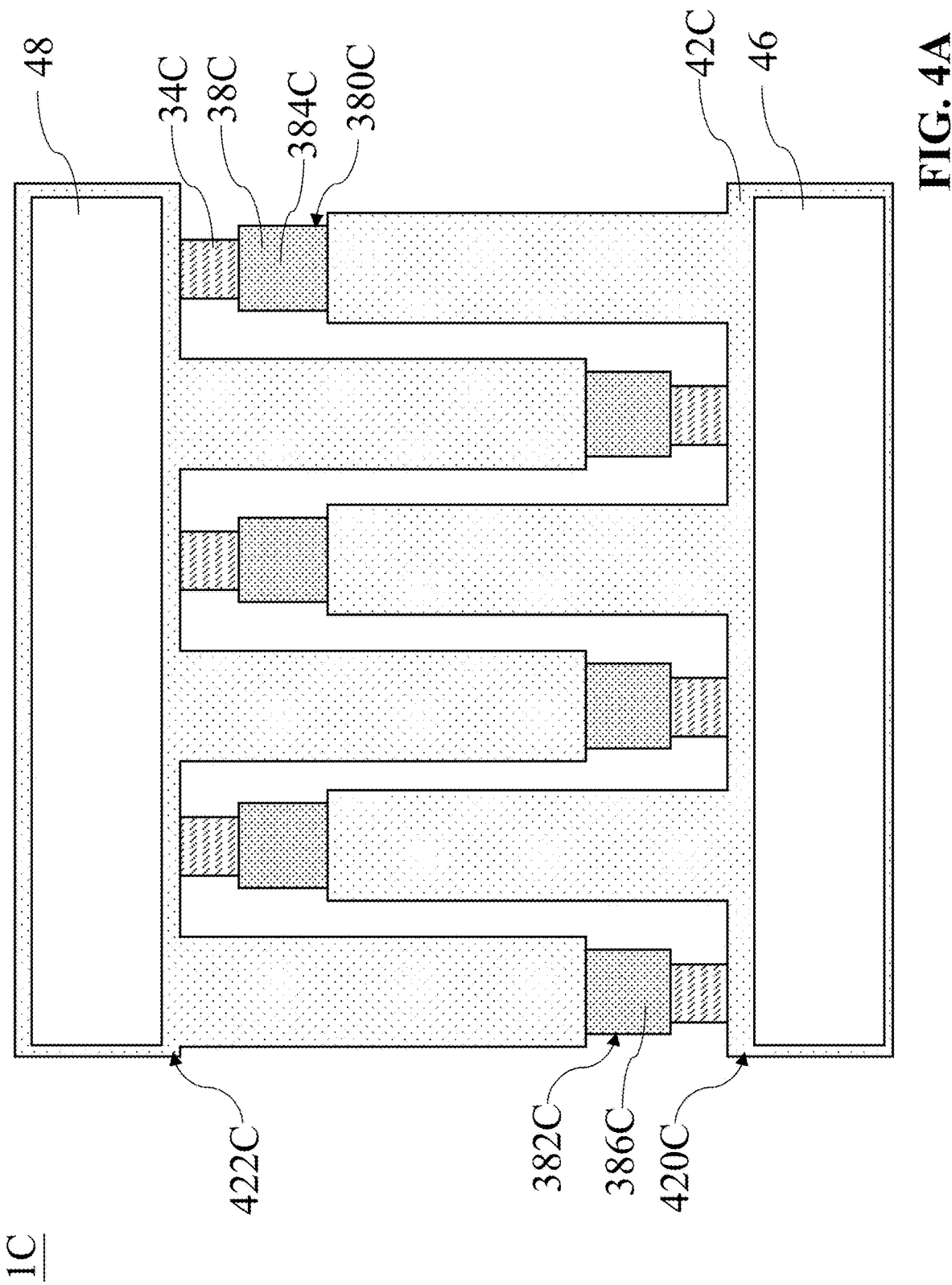
FIG. 4A is a top view of a semiconductor device according to some embodiments of the present disclosure.
Figure 4B:
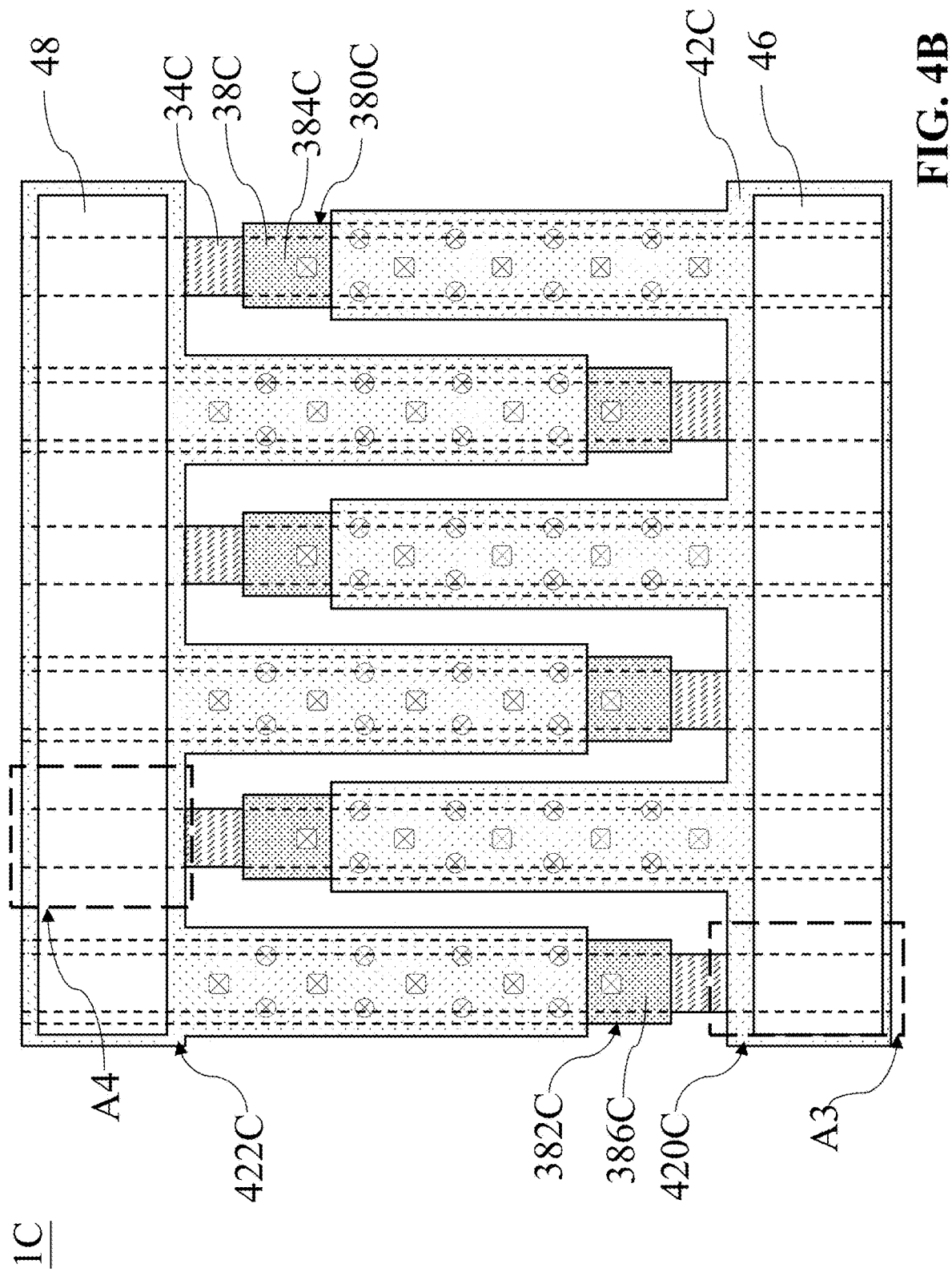
FIG. 4B depicts a further layout of the semiconductor device of FIG. 4A according to some embodiments of the present disclosure.

FIG. 4A is a top view of a semiconductor device 1C according to some embodiments of the present disclosure. FIG. 4B depicts a further layout of the semiconductor device 1C of FIG. 4A according to some embodiments of the present disclosure. The semiconductor device 1C is similar to the semiconductor device 1B as described and illustrated with reference to FIGS. 3A and 3B, except that the metal layer 38B is replaced by a metal layer 38C.

The metal layer 38C includes patterns 380C and 382C. The patterns 380C and 382C are separated from each other. The patterns 380C and 382C are electrically isolated from each other. The pattern 380C of the metal layer 38C has a plurality of strip portions 384C. The pattern 382C of the metal layer 38C has a plurality of strip portions 386C.

The strip portions 384C and 386C of the patterns 380C and 382C of the metal layer 38C can extend along a vertical direction of FIGS. 4A and 4B. The strip portions 384C and 386C of the patterns 380C and 382C of the metal layer 38C can be arranged along a horizontal direction of FIGS. 4A and 4B. The strip portions 384C and 386C of the patterns 380C and 382C of the metal layer 38C are parallel with each other.

The strip portions 384C of the patterns 380C can extend from a position beneath the electrode pad 46 toward the electrode pad 48. The strip portions 384C of the patterns 380C can extend to a position spaced apart from the electrode pad 48. That is, the strip portions 384C of the patterns 380C are free from the coverage of the electrode pad 48.

The strip portions 386C of the patterns 382C can extend from a position beneath the electrode pad 48 toward the electrode pad 46. The strip portions 386C of the patterns 382C can extend to a position spaced apart from the electrode pad 46. That is, the strip portions 386C of the patterns 382C are free from the coverage of the electrode pad 46.

The different metal layers 34C, 38C, 42C can be electrically coupled with each other by the corresponding contact vias, as afore described.

In the present embodiment, such the configuration can reduce overlapping areas between different metal layers. For example, since the strip portions 384C of the patterns 380C are free from the coverage of the electrode pad 48, no overlapping area between them is created. Therefore, reduction to parasitic capacitance can be achieved.

When a high voltage difference is applied to the semiconductor device 1C, an area A3 (see FIG. 4B) sandwiched between the pattern 420C of the metal layer 42C and the first one of the stripe patterns of the metal layer 34C is affected by the high voltage difference; and an area A4 (see FIG. 4B) sandwiched between the pattern 422C of the metal layer 42C and the second one of the stripe patterns of the metal layer 34C is affected by the high voltage difference. Dielectric layers within the areas A3 and A4 (e.g., the dielectric layers 26 and 28 in FIG. 1) can be formed to resist the electric field generated by the high voltage difference.

In some embodiment, dielectric layers (e.g., the dielectric layers 26 and 28 in FIG. 1) between the metal layers 34C and 42C can have a thickness enough to resist the high voltage difference. In some embodiment, dielectric layers between the metal layers 34C and 42C can have a dielectric constant enough to resist the high voltage difference. For example, dielectric layers between the metal layers 34C and 42C can include high k materials, in which the k number is greater than about 3.6.

Figure 5A:
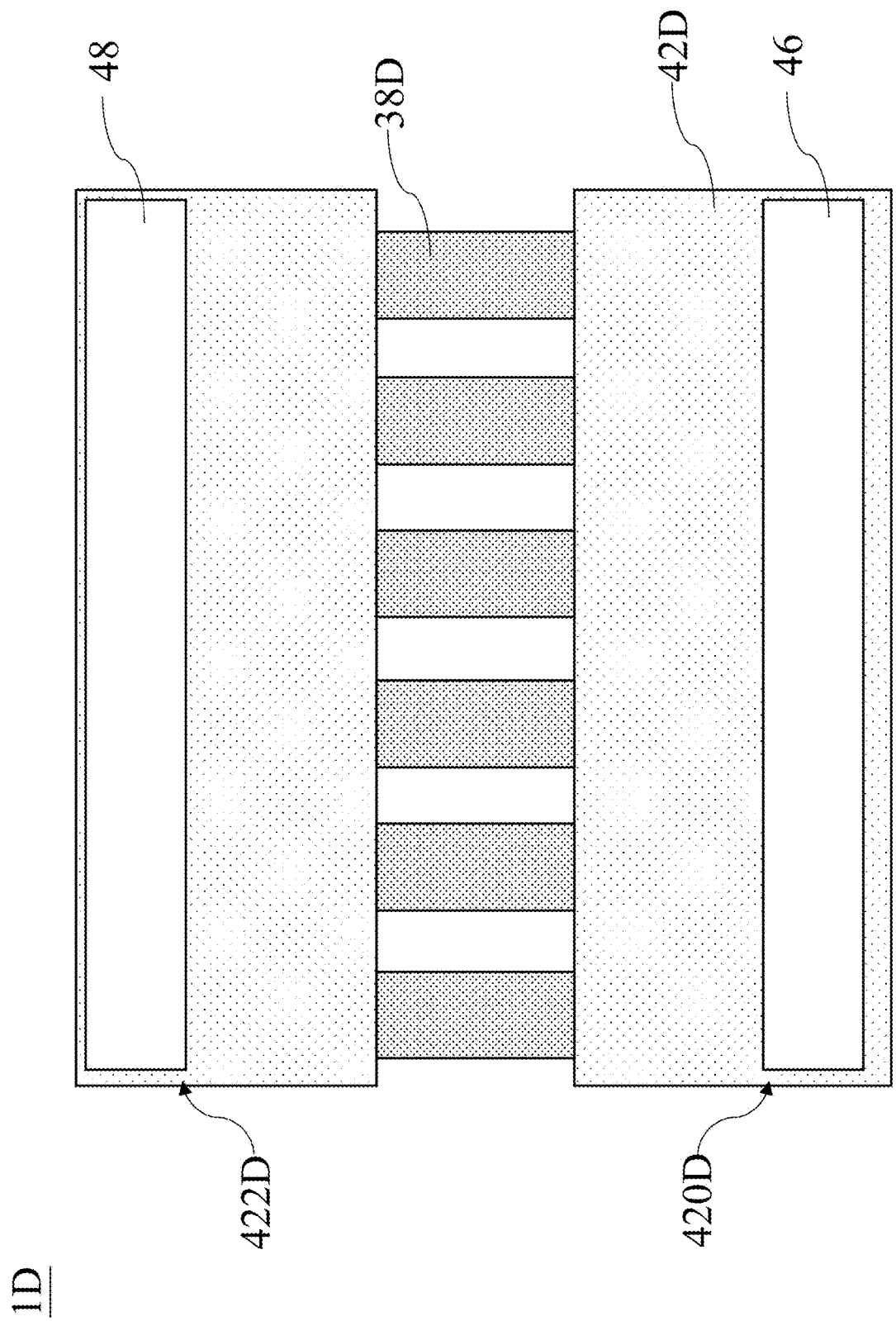
FIG. 5A is a top view of a semiconductor device according to some embodiments of the present disclosure.
Figure 5B:
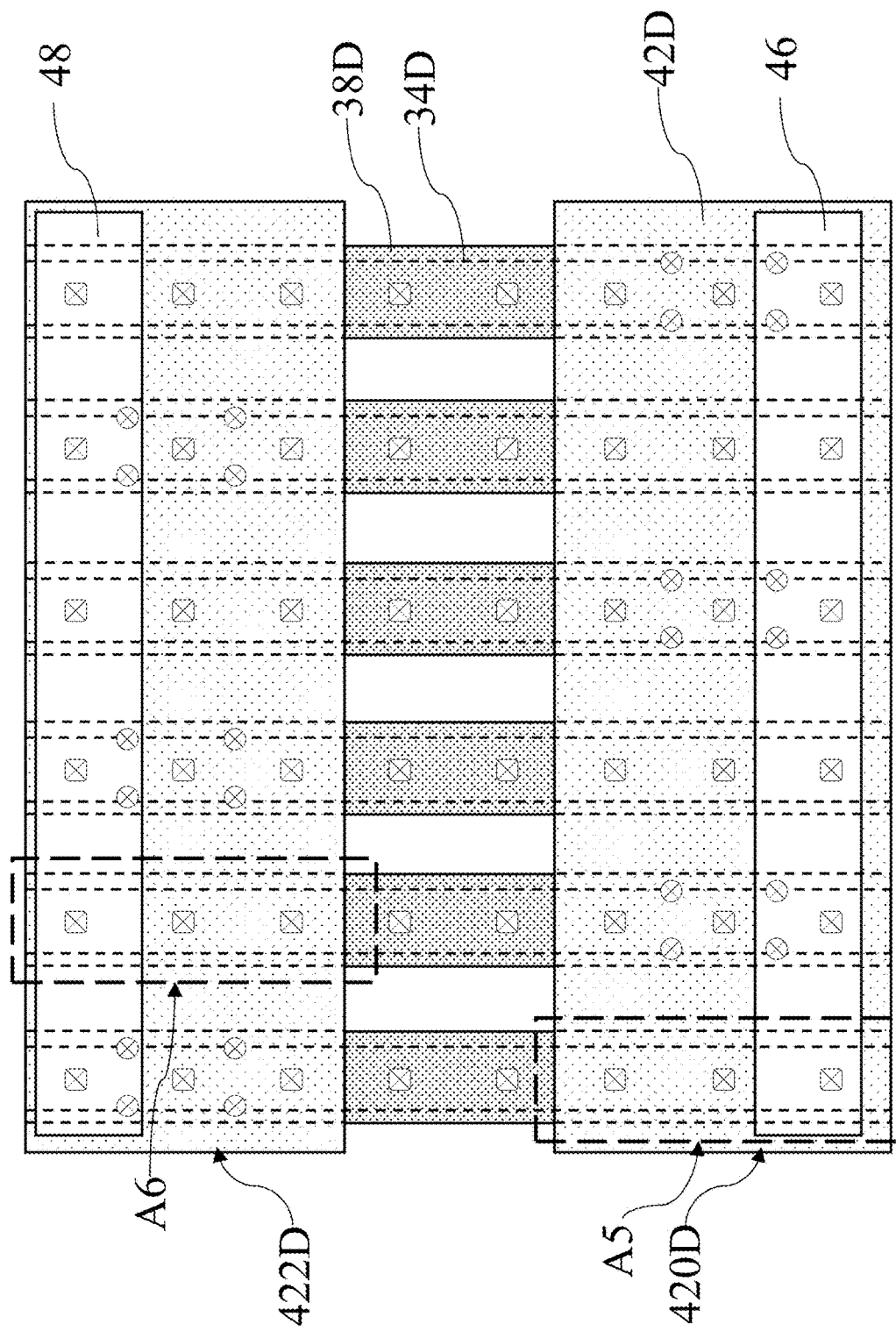
FIG. 5B depicts a further layout of the semiconductor device of FIG. 5A according to some embodiments of the present disclosure.

FIG. 5A is a top view of a semiconductor device 1D according to some embodiments of the present disclosure. FIG. 5B depicts a further layout of the semiconductor device 1D of FIG. 5A according to some embodiments of the present disclosure. The semiconductor device 1D is similar to the semiconductor device 1B as described and illustrated with reference to FIGS. 3A and 3B, except that the metal layer 42B is replaced by a metal layer 42D.

The metal layer 42D includes patterns 420D and 422D. The pattern 420D of the metal layer 42D extends from the electrode pad 46 toward the pattern 422D. The pattern 422D of the metal layer 42D extends from the electrode pad 48 toward the pattern 420D. The patterns 420D and 422D are separated from each other. The patterns 420D and 422D are electrically isolated from each other.

The patterns 420D and 422D of the metal layer 42D spans across the metal layer 38D. More specifically, the metal layer 38D has a plurality of strip portions parallel with each other. The strip portions of the metal layer 38D extend from a position beneath the electric pad 46D to a position beneath the electric pad 48D. The pattern 420D of the metal layer 42D spans across the strip portions of the metal layer 38D. The pattern 422D of the metal layer 42D spans across the strip portions of the metal layer 38D.

The different metal layers 34D, 38D, 42D can be electrically coupled with each other by the corresponding contact vias, as afore described.

Such the profile still can make the distribution of the generated electric field predicable. In this regard, when a high voltage difference is applied to the semiconductor device 1D, an area A5 (see FIG. 5B) sandwiched between the pattern 420D of the metal layer 42D and the first one of the stripe patterns of the metal layer 38D is affected by the high voltage difference; and an area A6 (see FIG. 5B) sandwiched between the pattern 422D of the metal layer 42D and the second one of the stripe patterns of the metal layer 38D is affected by the high voltage difference. A dielectric layer within the areas A5 and A6 (e.g., the dielectric layer 28 in FIG. 1) can be formed to resist the electric field generated by the high voltage difference.

In some embodiment, a dielectric layer (e.g., the dielectric layer 28 in FIG. 1) between the metal layers 38D and 42D can have a thickness enough to resist the high voltage difference. In some embodiment, a dielectric layer between the metal layers 38D and 42D can have a dielectric constant enough to resist the high voltage difference. For example, a dielectric layer between the metal layers 38D and 42D can include high k materials, in which the k number is greater than about 3.6.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A semiconductor device, comprising:
a nitride-based transistor disposed on a substrate;
a first metal layer disposed over the nitride-based transistor
a second metal layer disposed over the first metal layer, wherein the second metal layer has a plurality of first strip portions, wherein the first metal layer has a plurality of third strip portions vertically overlapping with the first strip portions, wherein each of the third strip portions is narrower than each of the first strip portions, wherein the first strip portion and the third strip portion extend along a first direction;
a third metal layer disposed over the second metal layer and comprising a first pattern and a second pattern which are spaced apart from each other;
a source pad immediately above the first metal layer, the second metal layer, and the first pattern of the third metal layer and electrically coupled with the nitride-based transistor; and
a drain pad immediately above the first metal layer, the second metal layer, and the second pattern of the third metal layer and electrically coupled with the nitride-based transistor.

2. The semiconductor device of claim 1, wherein an outer boundary of the source pad is located within the first pattern of the third metal layer.

3. The semiconductor device of claim 1, wherein an outer boundary of the drain pad is located within the second pattern of the third metal layer.

4. The semiconductor device of claim 1, wherein the first pattern has a first strip portion extending toward the second pattern and spaced apart from the second pattern.

5. The semiconductor device of claim 4, wherein the first strip portion of the first pattern vertically overlaps with the second metal layer.

6. The semiconductor device of claim 4, wherein the second pattern has a second strip portion extending toward the first pattern and spaced apart from the first pattern.

7. The semiconductor device of claim 6, wherein the first strip portion and the second strip portion extend along the first direction and are arranged along a second direction which is different than the first direction.

8. The semiconductor device of claim 6, wherein the first strip portion and the second strip portion are parallel with each other.

9. The semiconductor device of claim 6, wherein the second strip portion of the second pattern vertically overlaps with the second metal layer.

10. The semiconductor device of claim 1, wherein the second metal layer has a plurality of strip portions parallel with each other and extending from a position beneath the source pad to a position beneath the drain pad, and the first pattern spans across the strip portions of the second metal layer.

11. The semiconductor device of claim 10, wherein the second pattern spans across the strip portions of the second metal layer.

12. The semiconductor device of claim 10, wherein the first pattern extends toward the second pattern and is spaced apart from the second pattern.

13. The semiconductor device of claim 1, wherein the third metal layer has a plurality of second strip portions vertically overlapping with the first strip portions, wherein each of the first strip portions is narrower than each of the second strip portions.

14. The semiconductor device of claim 1, wherein the second metal layer further has a plurality of second strip portions parallel with the plurality of first strip portions, wherein the first strip portions extend from a position beneath the source pad to a position spaced apart from the drain pad, and the second strip portions extend from a position beneath the drain pad to a position spaced apart from the source pad.

15. The semiconductor device of claim 1, further comprising:
a first nitride-based semiconductor layer;
a second nitride-based semiconductor layer disposed on the first nitride-based semiconductor layer and having a bandgap greater than a bandgap of the first nitride-based semiconductor layer to form a heterojunction, wherein a two-dimensional electron gas (2DEG) region is generated at the heterojunction;
a source electrode and a drain electrode disposed above the second nitride-based semiconductor layer; and
a gate electrode disposed above the second nitride-based semiconductor layer and between the source electrode and the drain electrode, so as to form the nitride-based transistor with the 2DEG region.

16. A method for manufacturing a semiconductor device, comprising:
forming a nitride-based transistor over a substrate;
forming a first metal layer over the nitride-based transistor;
forming a second metal layer over the first metal layer, wherein the second metal layer has a plurality of first strip portions, wherein the first metal layer has a plurality of third strip portions vertically overlapping with the first strip portions, wherein each of the third strip portions is narrower than each of the first strip portions, wherein the first strip portion and the third strip portion extend along a first direction;
forming a third metal layer over the second metal layer and comprising a first pattern and a second pattern which are spaced apart from each other;
forming a source pad immediately above the first metal layer, the second metal layer, and the first pattern of the third metal layer; and forming a drain pad immediately above the first metal layer, the second metal layer, and the second pattern of the third metal layer.

17. The method of claim 16, wherein the source pad is formed to have an outer boundary located within the first pattern of the third metal layer.

18. The method of claim 17, wherein the source pad is formed to make contact with the first pattern of the third metal layer.

19. The method of claim 16, wherein the drain pad is formed to have an outer boundary located within the second pattern of the third metal layer.

20. The method of claim 19, wherein the drain pad is formed to make contact with the second pattern of the third metal layer.

* * * * *